United States Patent
Sela et al.

(10) Patent No.: US 11,435,920 B2
(45) Date of Patent: Sep. 6, 2022

(54) STORAGE SYSTEM AND METHOD FOR USING READ AND WRITE BUFFERS IN A MEMORY

(71) Applicant: Western Digital Technologies, Inc., San Jose, CA (US)

(72) Inventors: Rotem Sela, Haifa (IL); Einav Zilberstein, Had Hasharon (IL); Karin Inbar, Kfar Saba (IL)

(73) Assignee: Western Digital Technologies, Inc., San Jose, CA (US)

( * ) Notice: Subject to any disclaimer, the term of this patent is extended or adjusted under 35 U.S.C. 154(b) by 17 days.

(21) Appl. No.: 17/183,703

(22) Filed: Feb. 24, 2021

(65) Prior Publication Data

US 2022/0229555 A1    Jul. 21, 2022

Related U.S. Application Data

(60) Provisional application No. 63/139,526, filed on Jan. 20, 2021.

(51) Int. Cl.
*G06F 3/06* (2006.01)
*G06F 12/1009* (2016.01)
*G11C 11/56* (2006.01)

(52) U.S. Cl.
CPC ............ *G06F 3/064* (2013.01); *G06F 3/0604* (2013.01); *G06F 3/0673* (2013.01); *G06F 12/1009* (2013.01); *G06F 2212/657* (2013.01); *G11C 11/5621* (2013.01); *G11C 11/5671* (2013.01)

(58) Field of Classification Search
CPC ...... G06F 3/064; G06F 3/0604; G06F 3/0673; G06F 12/1009; G06F 2212/657; G11C 11/5621; G11C 11/5671
See application file for complete search history.

(56) References Cited

U.S. PATENT DOCUMENTS

| | | | | |
|---|---|---|---|---|
| 2017/0075812 A1* | 3/2017 | Wu | ...................... | G06F 12/0891 |
| 2018/0322051 A1* | 11/2018 | Heller | ................. | G06F 12/0868 |
| 2020/0034299 A1* | 1/2020 | Lee | ...................... | G06F 12/0246 |
| 2020/0104048 A1* | 4/2020 | Habbinga | ............. | G06F 3/0604 |
| 2021/0056016 A1* | 2/2021 | Bulusu | .................. | G06F 3/0619 |
| 2021/0342094 A1* | 11/2021 | Liu | ........................ | G06F 3/0604 |

(Continued)

OTHER PUBLICATIONS

Udin, Efe; "UFS 2.2 Standard Is Official: Uses a New Feature Called Writebooster"; Gizchina Chinese Gadget Reviews; Aug. 19, 2020; downloaded from the Internet at https://www.gizchina.com/2020/08/19/ufs-2-2-standard-is-official-uses-a-new-feature-called-writebooster/ on Jan. 11, 2021; 8 pages.

(Continued)

*Primary Examiner* — Sean D Rossiter
(74) *Attorney, Agent, or Firm* — Crowell & Moring LLP

(57) ABSTRACT

A storage system allocates single-level cell (SLC) blocks in its memory to act as a write buffer and/or a read buffer. When the storage system uses the SLC blocks as a read buffer, the storage system reads data from multi-level cell (MLC) blocks in the memory and stores the data in the read buffer prior to receiving a read command from a host for the data. When the storage system uses the SLC blocks as a write buffer, the storage system retains certain data in the write buffer while other data is flushed from the write buffer to MLC blocks in the memory.

20 Claims, 11 Drawing Sheets

(56) References Cited

U.S. PATENT DOCUMENTS

2022/0091984 A1\* 3/2022 Das ...................... G06F 3/0656

OTHER PUBLICATIONS

Vasan, G.S.; "UFS 3.1 vs UFS 3.0 Comparison: What's New and Different?"; Smartprox.com; Dec. 29, 2020; downloaded from the Internet at https://www.smartprix.com/bytes/ufs-3-1-vs-ufs-3-0-comparison-new-features/ on Jan. 11, 2021; 6 pages.

\* cited by examiner

STORAGE SYSTEM AND METHOD FOR USING READ AND WRITE BUFFERS IN A MEMORY

CROSS-REFERENCE TO RELATED APPLICATION

This application claims the benefit of U.S. provisional patent application No. 63/139,526, filed Jan. 20, 2021, which is hereby incorporated by reference.

BACKGROUND

In order to save cost, a storage system can store data in multi-level cell (MLC) (e.g., triple-level cell (TLC) or quad-level cell (QLC)) blocks in its memory instead of single-level cell (SLC) blocks. However, SLC blocks typically have a faster write speed. To improve write performance, some storage systems use SLC blocks as a write buffer, where data is initially stored in the write buffer and later flushed to MLC blocks in the memory. For example, the WriteBooster™ feature in the Universal Flash Storage (UFS) standard creates an SLC cache in flash memory that can be used to improve write speed.

DETAILED DESCRIPTION

Figure 1A:
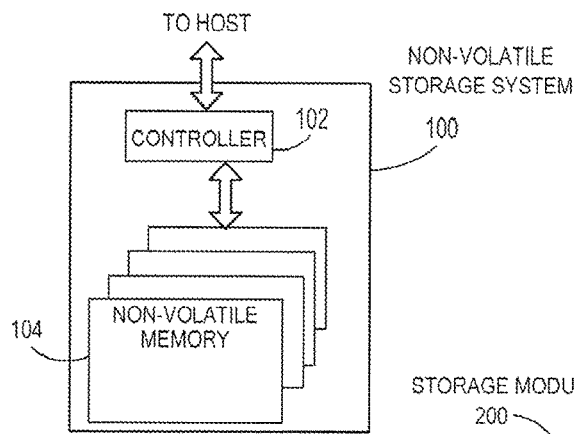
FIG. 1A is a block diagram of a non-volatile storage system of an embodiment.
Figure 1B:
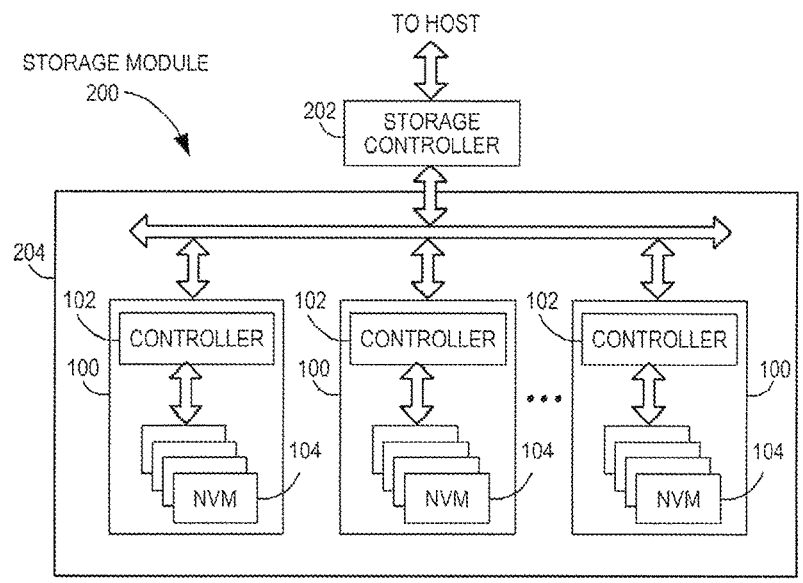
FIG. 1B is a block diagram illustrating a storage module of an embodiment.
Figure 1C:
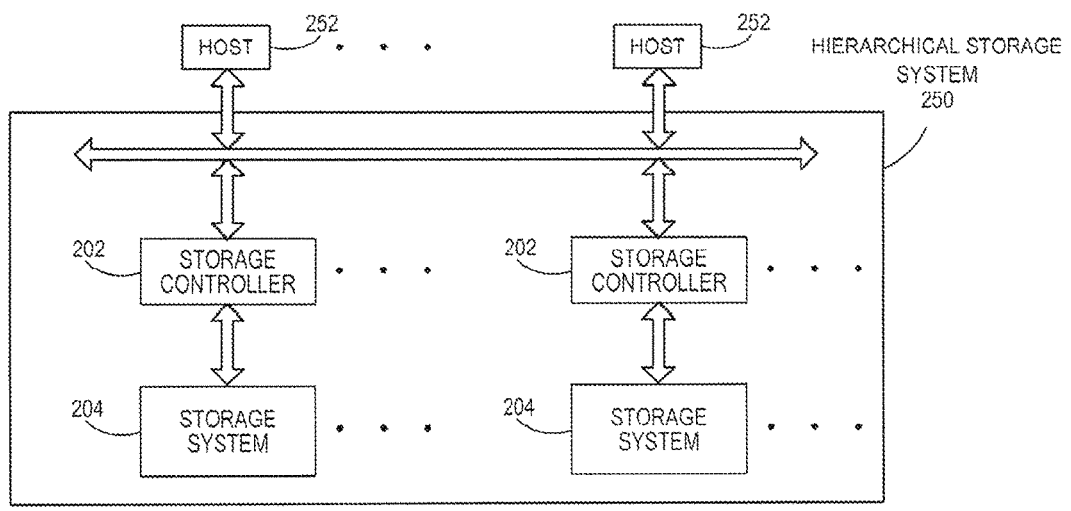
FIG. 1C is a block diagram illustrating a hierarchical storage system of an embodiment.

Turning now to the drawings, storage systems suitable for use in implementing aspects of these embodiments are shown in FIGS. 1A-1C. FIG. 1A is a block diagram illustrating a non-volatile storage system 100 (sometimes referred to herein as a storage device or just device) according to an embodiment of the subject matter described herein. Referring to FIG. 1A, non-volatile storage system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a non-volatile memory controller (e.g., a flash, resistive random-access memory (ReRAM), phase-change memory (PCM), or magnetoresistive random-access memory (MRAM) controller)) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a non-volatile memory controller is a device that manages data stored on non-volatile memory and communicates with a host, such as a computer or electronic device. A non-volatile memory controller can have various functionality in addition to the specific functionality described herein. For example, the non-volatile memory controller can format the non-volatile memory to ensure the memory is operating properly, map out bad non-volatile memory cells, and allocate spare cells to be substituted for future failed cells. Some part of the spare cells can be used to hold firmware to operate the non-volatile memory controller and implement other features. In operation, when a host needs to read data from or write data to the non-volatile memory, it can communicate with the non-volatile memory controller. If the host provides a logical address to which data is to be read/written, the non-volatile memory controller can convert the logical address received from the host to a physical address in the non-volatile memory. (Alternatively, the host can provide the physical address.) The non-volatile memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused). Also, the structure for the "means" recited in the claims can include, for example, some or all of the structures of the controller described herein, programmed or manufactured as appropriate to cause the controller to operate to perform the recited functions.

Non-volatile memory die 104 may include any suitable non-volatile storage medium, including resistive random-access memory (ReRAM), magnetoresistive random-access memory (MRAM), phase-change memory (PCM), NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, storage system 100 may be a card based system, such as a secure digital (SD) or a micro secure digital (micro-SD) card. In an alternate embodiment, storage system 100 may be part of an embedded storage system.

Although, in the example illustrated in FIG. 1A, non-volatile storage system 100 (sometimes referred to herein as a storage module) includes a single channel between controller 102 and non-volatile memory die 104, the subject matter described herein is not limited to having a single memory channel. For example, in some storage system architectures (such as the ones shown in FIGS. 1B and 1C), 2, 4, 8 or more memory channels may exist between the controller and the memory device, depending on controller capabilities. In any of the embodiments described herein, more than a single channel may exist between the controller and the memory die, even if a single channel is shown in the drawings.

FIG. 1B illustrates a storage module 200 that includes plural non-volatile storage systems 100. As such, storage module 200 may include a storage controller 202 that interfaces with a host and with storage system 204, which includes a plurality of non-volatile storage systems 100. The interface between storage controller 202 and non-volatile storage systems 100 may be a bus interface, such as a serial advanced technology attachment (SATA), peripheral component interconnect express (PCIe) interface, or double-data-rate (DDR) interface. Storage module 200, in one embodiment, may be a solid state drive (SSD), or non-volatile dual in-line memory module (NVDIMM), such as found in server PC or portable computing devices, such as laptop computers, and tablet computers.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment, the bus interface may be a Non-Volatile Memory Express (NVMe) or fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
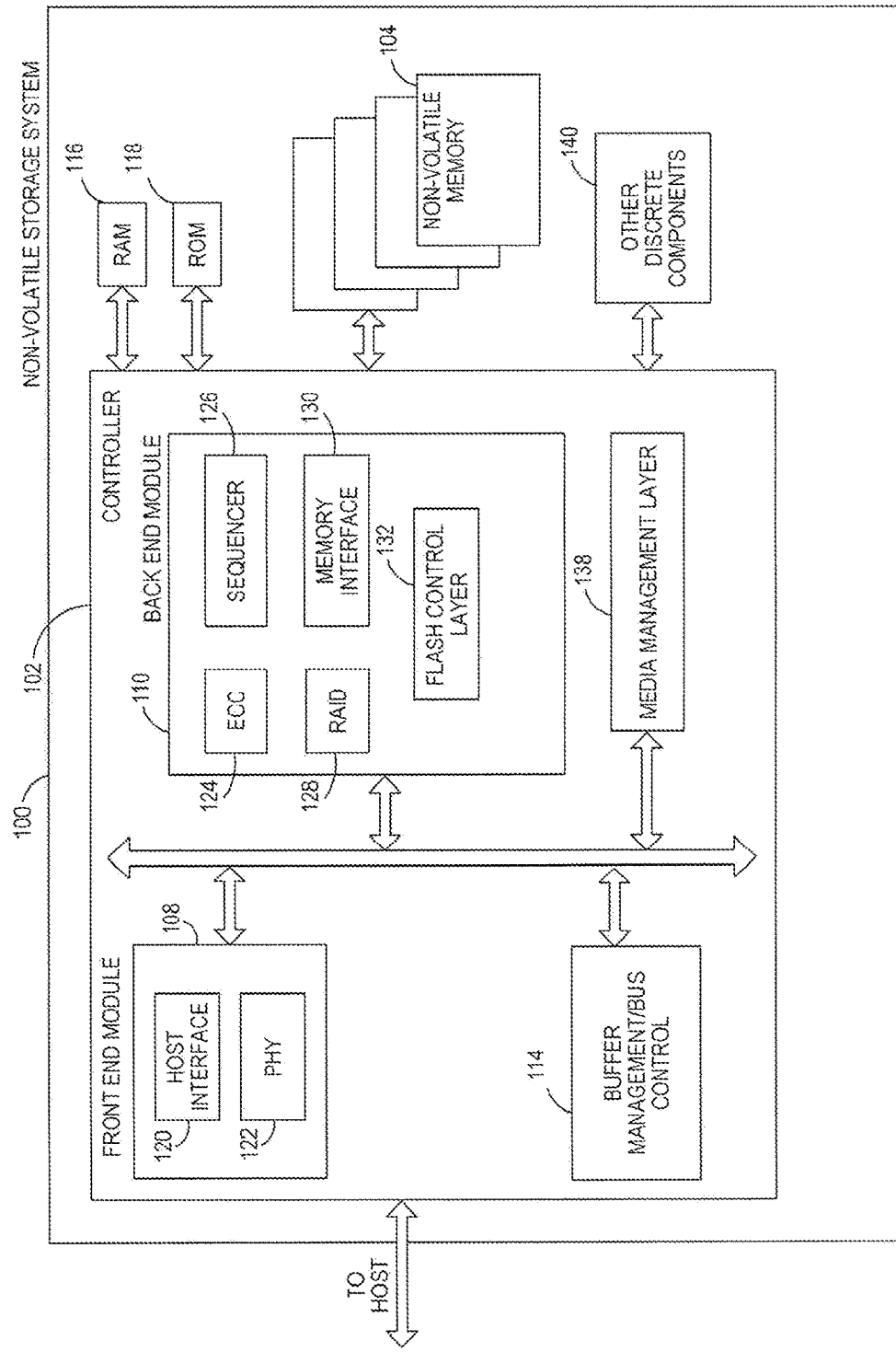
FIG. 2A is a block diagram illustrating components of the controller of the non-volatile storage system illustrated in FIG. 1A according to an embodiment.

FIG. 2A is a block diagram illustrating components of controller 102 in more detail. Controller 102 includes a front end module 108 that interfaces with a host, a back end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example. The controller 102 may sometimes be referred to herein as a NAND controller or a flash controller, but it should be understood that the controller 102 can be used with any suitable memory technology, example of some of which are provided below.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, serially attached small computer system interface (SAS), Fibre Channel, universal serial bus (USB), PCIe, and NVMe. The host interface 120 typically facilitates transfer for data, control signals, and timing signals.

Back end module 110 includes an error correction code (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

The storage system 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
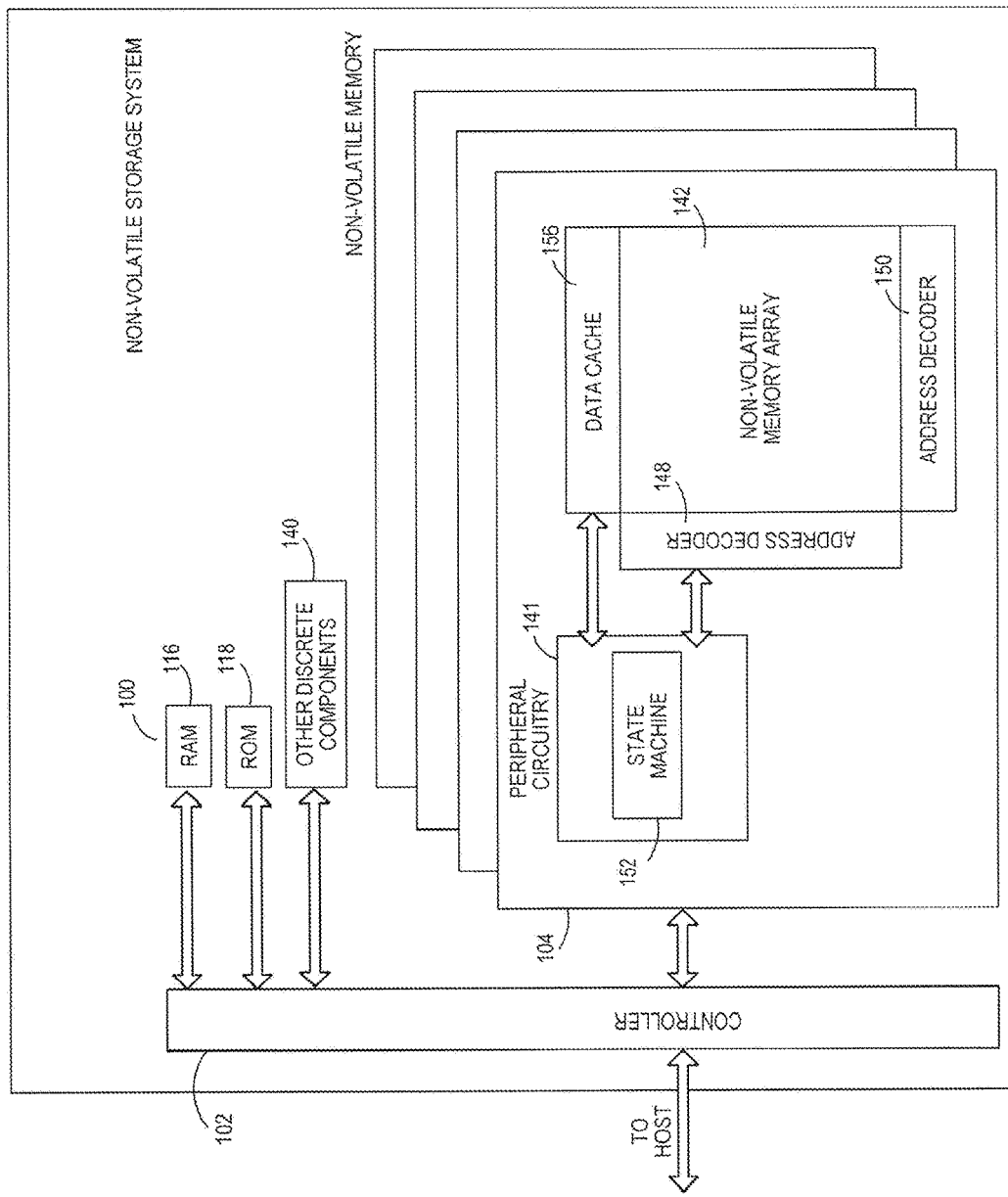
FIG. 2B is a block diagram illustrating components of the non-volatile storage system illustrated in FIG. 1A according to an embodiment.

FIG. 2B is a block diagram illustrating components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including ReRAM, MRAM, PCM, NAND flash memory cells and/or NOR flash memory cells in a two dimensional and/or three dimensional configuration. Non-volatile memory die 104 further includes a data cache 156 that caches data. Peripheral circuitry 141 includes a state machine 152 that provides status information to the controller 102.

Returning again to FIG. 2A, the flash control layer 132 (which will be referred to herein as the flash translation layer (FTL) or, more generally, the "media management layer," as the memory may not be flash) handles flash errors and interfaces with the host. In particular, the FTL, which may be an algorithm in firmware, is responsible for the internals of memory management and translates writes from the host into writes to the memory 104. The FTL may be needed because the memory 104 may have limited endurance, may only be written in multiples of pages, and/or may not be written unless it is erased as a block. The FTL understands these potential limitations of the memory 104, which may not be visible to the host. Accordingly, the FTL attempts to translate the writes from host into writes into the memory 104.

The FTL may include a logical-to-physical address (L2P) map (sometimes referred to herein as a table or data structure) and allotted cache memory. In this way, the FTL translates logical block addresses ("LBAs") from the host to physical addresses in the memory 104. The FTL can include other features, such as, but not limited to, power-off recovery (so that the data structures of the FTL can be recovered in the event of a sudden power loss) and wear leveling (so that the wear across memory blocks is even to prevent certain blocks from excessive wear, which would result in a greater chance of failure).

Figure 3:
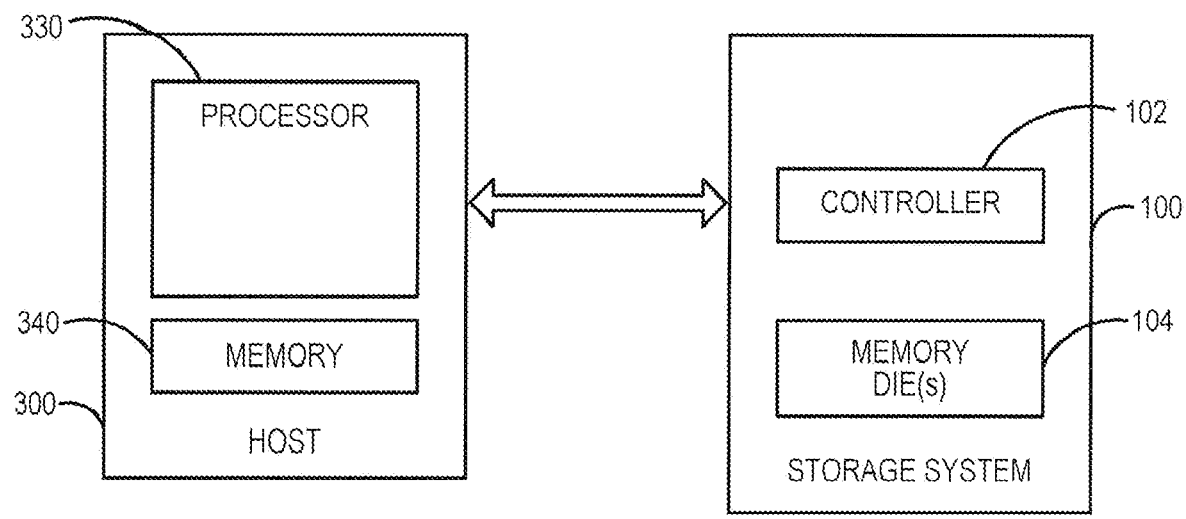
FIG. 3 is a diagram of a host and a storage system of an embodiment.

Turning again to the drawings, FIG. 3 is a block diagram of a host 300 and storage system (sometimes referred to herein as a device) 100 of an embodiment. The host 300 can take any suitable form, including, but not limited to, a computer, a mobile phone, a digital camera, a tablet, a wearable device, a digital video recorder, a surveillance system, etc. The host 300 comprises a processor 330 that is configured to send data (e.g., initially stored in the host's memory 340) to the storage system 100 for storage in the storage system's memory 104.

As described above, in order to save cost, a storage system can store data in multi-level cell (MLC) (e.g., triple-level cell (TLC) or quad-level cell (QLC)) blocks in its memory instead of single-level cell (SLC) blocks. However, SLC blocks typically have a faster write speed. To improve write performance, some storage systems use SLC blocks as a write buffer, where data is initially stored in the write buffer and later flushed to MLC blocks in the memory. For example, the WriteBooster™ feature in the Universal Flash Storage (UFS) standard creates an SLC cache in flash memory that can be used to improve write speed.

Reading data from MLC blocks may be slower than reading data from SLC blocks, and, at certain times, a host may require improved read performance (e.g., low latency/ high bandwidth) for specific data/files. To improve read latency/performance in such situations, some storage systems delay copying some of the data to MLC blocks (thereby keeping that data in SLC blocks) in an attempt to accelerate read performance or latency later on. However, this approach to accelerating reads is limited to recently-written data. Other storage systems reduce read latency by addressing different execution aspects that contribute to processing latency. For example, a read command can be marked with a high-priority bit. After the storage system identifies the command as being marked high-priority, the storage system can place the command at the head of its execution pipeline by marking the read command as the next command to be served.

As another example, the host can send a pre-fetch command to the storage system, which causes the storage system to read-ahead logical-to-physical address table information of the logical block address (LBA) of that command or read data of that command to its volatile memory in order to serve the read command with improved latency. However, since volatile memory is expensive, this approach provides only limited performance improvement because storage systems typically have a limited amount of volatile memory, allowing only a small amount of data to be a pre-fetched.

Figure 4:
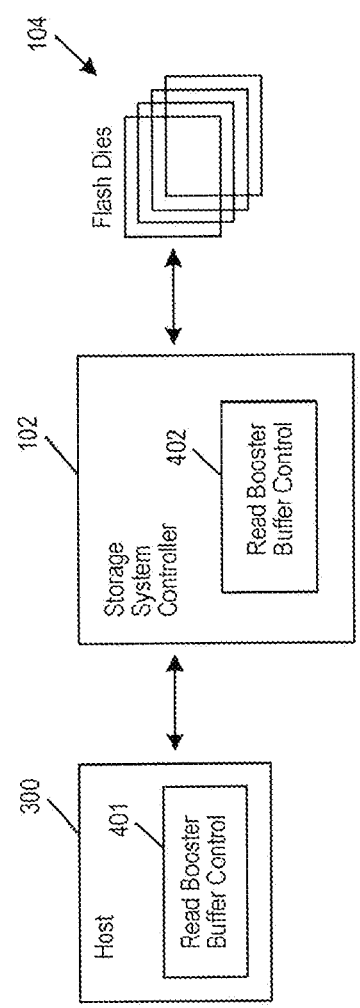
FIG. 4 is a diagram of a host and a storage system controller of an embodiment having respective read booster buffer control modules.

The following embodiments can be used to utilize memory properties to improve read performance. As shown in FIG. 4, in one embodiment, the host 300 and storage system 100 have respective read booster buffer control modules 401, 402 that cause the storage system 100 to store data read from MLC blocks in the memory 104 and store it in a read buffer allocated from SLC blocks in the memory 104 prior to receiving the official read command for the data from the host 300. By storing the data in the read buffer ahead of time, read performance is improved because, when the official read command is received from the host 300, the data is read from the faster SLC blocks of the read buffer instead of the slower MLC blocks that store the data.

It should be noted that while SLC and MLC blocks are used in the below examples, any two sets of memory blocks can be used, where one set of memory blocks has a lower latency than the other (main) set of memory blocks. For example, one set of memory blocks can be XPOINT memory, while the other set of memory blocks can be flash memory.

The storage system 100 can create the read buffer in any suitable way. In one embodiment, the controller 102 of the storage system 100 creates the read buffer from allocated SLC blocks in the memory 104. For example, during provisioning of the storage system 100, an original equipment manufacturer (OEM) or vendor can configure the size of the read buffer (sometimes referred to herein as the "Read-Booster Buffer"). In response, the controller 102 of the storage system 100 can allocate the appropriate number of memory blocks with improved read time (e.g. SLC blocks) to serve as the ReadBooster Buffer The allocated read buffer in the memory 104 may be made available for use at any time, hence reducing the storage capacity of the memory 104. Alternatively, the allocated read buffer may be available only in an opportunistic manner (e.g., only if there is enough free space in the memory 104, wherein the allocated SLC blocks can be reallocated to MLC blocks for regular data storage if the memory 104 is full (e.g., above a certain threshold). Also, allocated SLC blocks can be used exclusively as a read buffer or can also be used for other purposes, such as a WriteBooster Buffer.

In operation, the controller 102 of the storage system 100 reads data stored in MLC blocks in the memory 104 and write that data to the read buffer. The size of the read buffer in SLC blocks in the memory 104 is likely to be much larger than the size of the storage system's volatile memory. So, this embodiment can be used to store more data than prior pre-fetch approaches that use the volatile memory. Also, SLC memory is less expensive than volatile memory.

Figure 5:
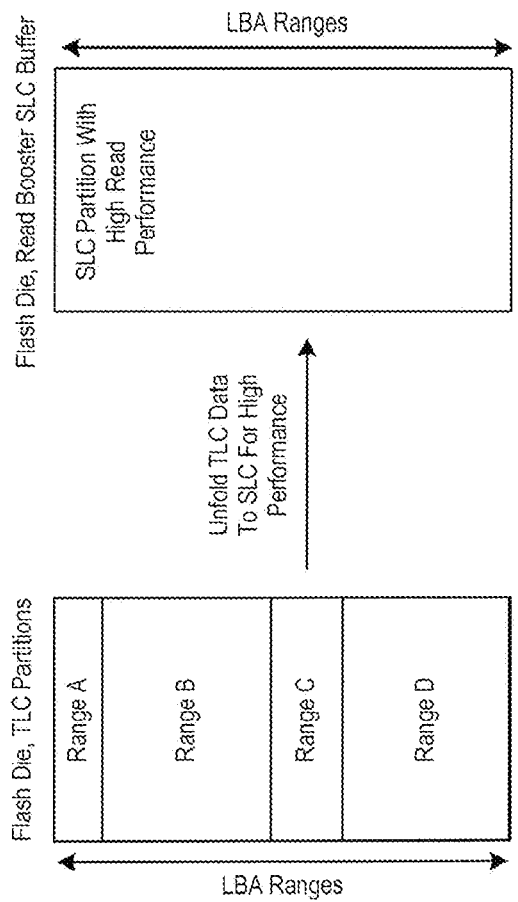
FIG. 5 is a diagram illustrating an unfolding operation of an embodiment.

FIG. 5 illustrates the unfolding of MLC data (in this example, TLC data) to the SLC read buffer. In this embodiment, the TLC data is unfolded to the SLC read buffer according to a host request in advance of the actual read command, according to a host application. This is performed before the storage system 100 receives the official command from the host 300 to read the data. This "pre-reading" can be triggered by the host 300. For example, the host 300 can provide a special command to the storage system 100 with one or more logical block addresses (LBAs) (e.g., an LBA range or multiple LBA ranges) that require improved read performance. Alternatively, this "pre-reading" can be triggered by the storage system 100. For example, the controller 102 can attempt to predict the LBAs that the host 300 will request in the future (e.g., an LBA range that is frequently read by the host 300) and pre-read the data in those LBAs.

In either event, when the storage system 100 later receives the official read command from the host 300, the storage system 100 reads and returns the data from the faster write buffer instead of the slower MLC blocks, which increase read performance.

There are many alternatives that can be used with these embodiments. For example, the data read from the MLC blocks can be moved or copied from the MLC blocks to the read buffer. In a move operation, the original data in the MLC blocks would be deleted and later would need to be flushed back from the read buffer. For example, the flushing can be done in response to a flush command from the host 300 (e.g., when the host 300 no longer needs improved read performance). A flush command may contain an indication of how much of the read buffer to flush (e.g., in terms of a percentage) or which LBAs to flush. Alternatively, the flushing can be done in response to a flush policy of the storage system 100 (e.g., when detecting that the LBA range has not been accessed recently (is "cold")). The controller 104 can be configured to move data between the MLC and SLC blocks in a controlled manner to prevent damaging the memory's health. If the data is copied (instead of moved) to the read buffer and is not changed there, there would not be a need to flush the data back.

As another alternative, if the data is fragmented in the MLC blocks, the controller 104 can defragment the data before writing the data in the read buffer. Such physical defragmenting may improve further reads from the read buffer and potentially also improve future read performance from the MLC blocks if the data is later flushed back to the MLC blocks. Further data that is stored in the MLC blocks in a random fashion can be stored in a sequential fashion in the read buffer. In yet another alternative, the controller 102 can copy, from the memory 104 to volatile memory in the storage system 100, a portion of a logical-to-physical address table stored in the memory 104 pertaining to the data that is written in the read buffer. This can be done, for example, in response to a special command from the host 300. Also, the controller 102 can choose not to move/copy data based on the health of the memory 104.

Additionally, the controller 104 can be configured to provide various attributes, including, but not limited to, an indication of a maximum size of the read buffer, an indication of when a flush operation is completed, an indication of the fullness of the read buffer, and an indication of the health of the read buffer and/or other blocks of the memory 104.

Figure 6:
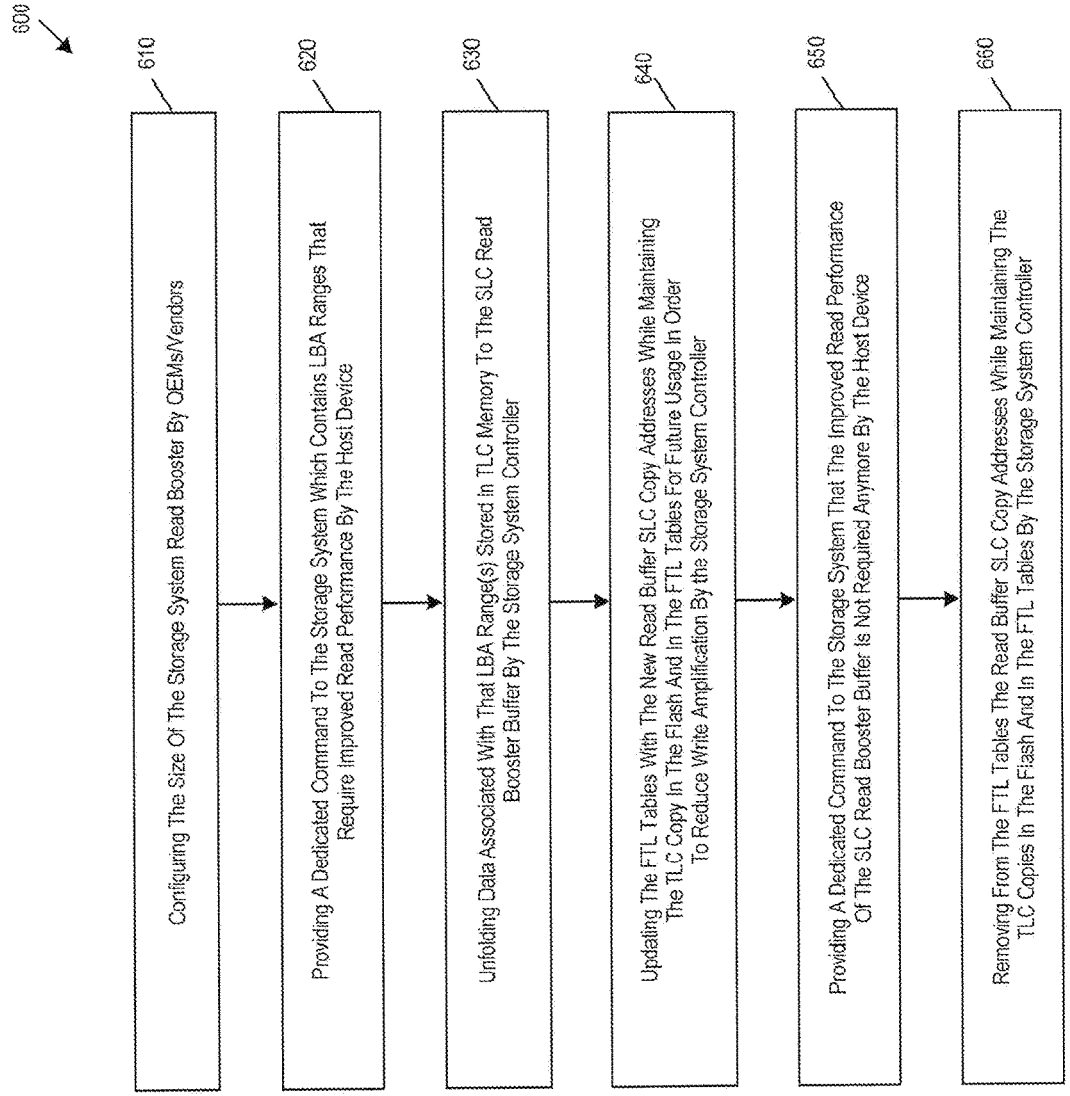
FIG. 6 is a flow chart of a method of an embodiment for using a read booster.

Returning to the drawings, FIG. 6 is a flow chart 600 of a method of an embodiment for using the read buffer in an example environment. It should be noted that this is merely an example, and other implementations can be used. As shown in FIG. 6, the size of the read buffer can be configured, for example, by an OEM or vendor (act 610). Next, a dedicated command is provided to the storage system 100 that contains LBA ranges that require improved read performance by the host 300 (act 620). Then, the controller 102 of the storage system 100 unfolds data associated with the LBA ranges stored in the TLC memory to the SLC read buffer (act 630). The controller 102 then updates the flash translation (FTL) tables with the new read buffer SLC copy addresses while maintaining the TLC copy in the memory 104 and in the FTL tables for future usage in order to reduce write amplification (act 640). A dedicated command is then provided by the host 300 to the storage system 100 indicating that the improved read performance of the SLC read buffer is not required anymore (act 660). Finally, the controller 102 removes, from the FTL tables, the read buffer SLC copy addresses while maintaining the TLC copies in the memory 104 and in the FTL tables (act 670). As can be seen by this example, this embodiment can be used to provide a mechanism for improving read performance for an LBA range, which can be important for the host 300. In addition, the process of copying the data back from SLC blocks to TLC blocks may be used by the storage system 100 to physically defragment the data.

While the above paragraphs described embodiments related to a read buffer, the following paragraphs describe embodiments that can be used with a write buffer. It should be noted that these embodiments can be used alone or in combination.

As noted above, SLC blocks in the memory can be used as a write buffer to provide high performance for host bursts. In order to save cost, SLC blocks are used as a temporary buffer with limited size, and the data is flushed from the SLC blocks to the lower-cost MLC blocks using a dedicated flush command Since the write buffer may become a bottleneck if it is not evacuated fast enough, the storage system can be is configured to fold the SLC data stored in the write buffer as fast as possible, and the host can make sure that flush is always enabled. However, in some host application cases, this operation can result in sub-optimal read performance, power waste, and excessive write amplification on the MLC blocks. These sub-optimal behaviors are due to early evacuation of the data from the write buffer.

Consider, for example, the situation in which there are high frequency reads from a game just installed on the host. With the current write buffer behavior, the game files would be flushed very fast to the MLC blocks, and read performance would be of MLC reads instead of the more-optimized SLC reads. Another example is re-writing temporary data to the memory. For example, certain applications may store a temporary zip file in the memory during installation, and this zip file may no longer be needed or used once the zip file is opened. Moving a temporary file that is soon to be discarded or re-written to the MLC blocks will result in unnecessary waste of storage energy and cause excessive writes to the MLC blocks, which are more limited in programming/erase cycles and endurance capabilities then the SLC blocks.

If the write buffer is managed by the storage system, a possible solution to this problem can be for the storage system to use an evacuation policy in which the last-written data remains longer in the write buffer (e.g., the last 200 megabytes up to one gigabyte may be retained longer in the SLC write buffer). If the write buffer is managed by the host, a possible solution to this problem is for the host to disable the flush command during certain periods of times. This would result in keeping the last-written data in the write buffer until the flush command is enabled again by the host. However, both of these possible solutions allow only keeping the last-written data and are still suboptimal because, in some cases, the last-written data is not necessarily the data that the host will access next. Further, neither the host nor the storage system has the ability to distinguish between application data that should be kept in the write buffer and application data that should not be kept. Accordingly, these possible solutions can result in unnecessary data being kept in the write buffer, taking expensive SLC space and turning the write buffer into a bottleneck.

Figure 7:
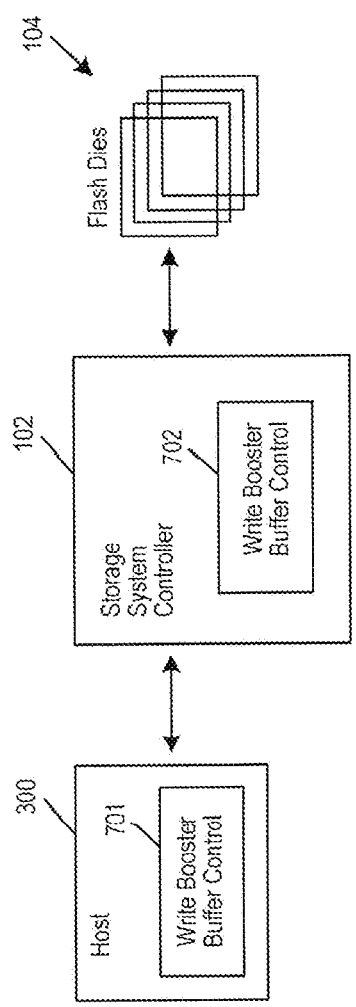
FIG. 7 is a diagram of a host and a storage system controller of an embodiment having respective write booster buffer control modules.

The following embodiments can be used to avoid these sub-optimal behaviors and, by that, can improve read latency, energy, and lifetime of the memory. As shown in FIG. 7, in one embodiment, the host 300 and storage system 100 have respective write booster buffer control modules 701, 702. With these modules, when the storage system 100 receives a command to flush the write buffer to MLC blocks in the memory 104, the storage system 100 determines whether the data is to be retained in the write buffer despite the flush command. If the data is to be retained, the data is kept in the write buffer despite the flush command. The host 300 can later send a separate command to the storage system 100 to flush the data retained in the write buffer.

The storage system 100 can use any suitable way to determine that data should be retained in the write buffer. For example, in one embodiment, the host 300 sends the storage system 100 information indicating that the data is to be retained in the write buffer despite a flush command. This information can take any suitable form, such as, but not limited to, a dedicated command or bits that the host 300 uses to mark the data with a certain retention level. For example, the host 300 can mark application data that the host 300 expects to access soon and, as such, will want to maintain in the SLC write buffer longer than other data. When the controller 102 of the storage system 100 receives the marked application data, it can maintain that marked data in the SLC write buffer even after getting a general flush command from the host 100. So, in this embodiment, the SLC write buffer can have two evacuation policies from the SLC write buffer. One policy would state that regular, unmarked data will be flushed in response to receiving a flush command from the host. The other policy would state that the marked data (for high retention) will be maintained longer in the SLC write buffer and will be evacuated by a specially-marked ("retention") flush command.

So, in one embodiment, the host 300 provides a special indication to the storage system 100 that an application retention policy is needed. This indication can be done, for example, using a dedicated command that informs the storage system 100 that all data written from that point on belongs to the application with a high-retention policy. Alternatively, this can be done using retention bits in the write command itself, where the bit is set to zero on writes that do not require a special retention policy. It should be noted that there may be several bits for retention marking if the host 300 would like to control several levels of retention priorities or order.

Figure 8:
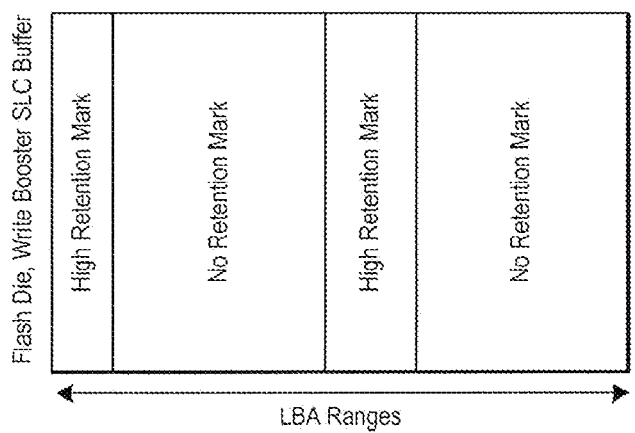
FIG. 8 is a diagram illustrating retention marks used with a write booster of an embodiment.
Figure 9:
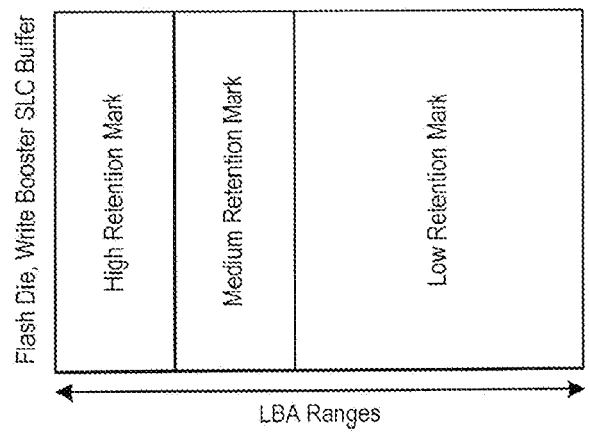
FIG. 9 is a diagram illustrating three retention marks of an embodiment.

For example, FIG. 8 illustrates write buffer LBA ranges with data marked with high and low retention, where the evacuation from the write buffer will be performed accordingly. The marked data will be retained longer in the buffer even if a regular flush command is executed. As another example, FIG. 9 illustrates the write buffer LBA ranges, where data may be marked with more priorities (e.g., high, medium, and low) and the evacuation from the buffer will be performed accordingly. The LBA ranges may be fixed and contiguous or interleaved. It should also be noted that these are merely examples, and other implementations can be used.

Following the special indication, the storage system 100 can mark the application data that requires high retention and not flush it from the write buffer even if the regular write buffer flush is enabled. At a later point, when the host 300 does not expect any further access or use of the application, the host 300 can send a special flush command with the relevant retention bit. In response, the storage system 100 can move the application data marked with the relevant retention bit from the SLC blocks to the MLC blocks in the memory 104 and free up the relevant space in the write booster for new application data. The storage system 100 may have its own policy on how to flush the high-retention application data and in which order.

As mentioned above, the write buffer can be configured in any suitable way. For example, the host 300 can set the maximum size (e.g., in term of percentage) of the write buffer that can be consumed by application high-retention data. The host 300 can allow up to 100% of the write buffer if this is desired or can limit it to a lower level in order to guarantee that write buffer will be flushed and available for new bursts up to a certain predefined threshold. The host 300 can configure different set of priorities to different retention bits if it wants the storage system 100 to apply different evacuation priorities to different applications with high retention.

Additionally, the controller 104 can be configured to provide various attributes, including, but not limited to, an indication of the write buffer's current and available space that is consumed by high retention applications, when a special retention flush operation is completed, and the amount of retention application data that is kept in the write buffer (this attribute may provide total size for all application retention data or separate size per each type of retention bit).

Figure 10:
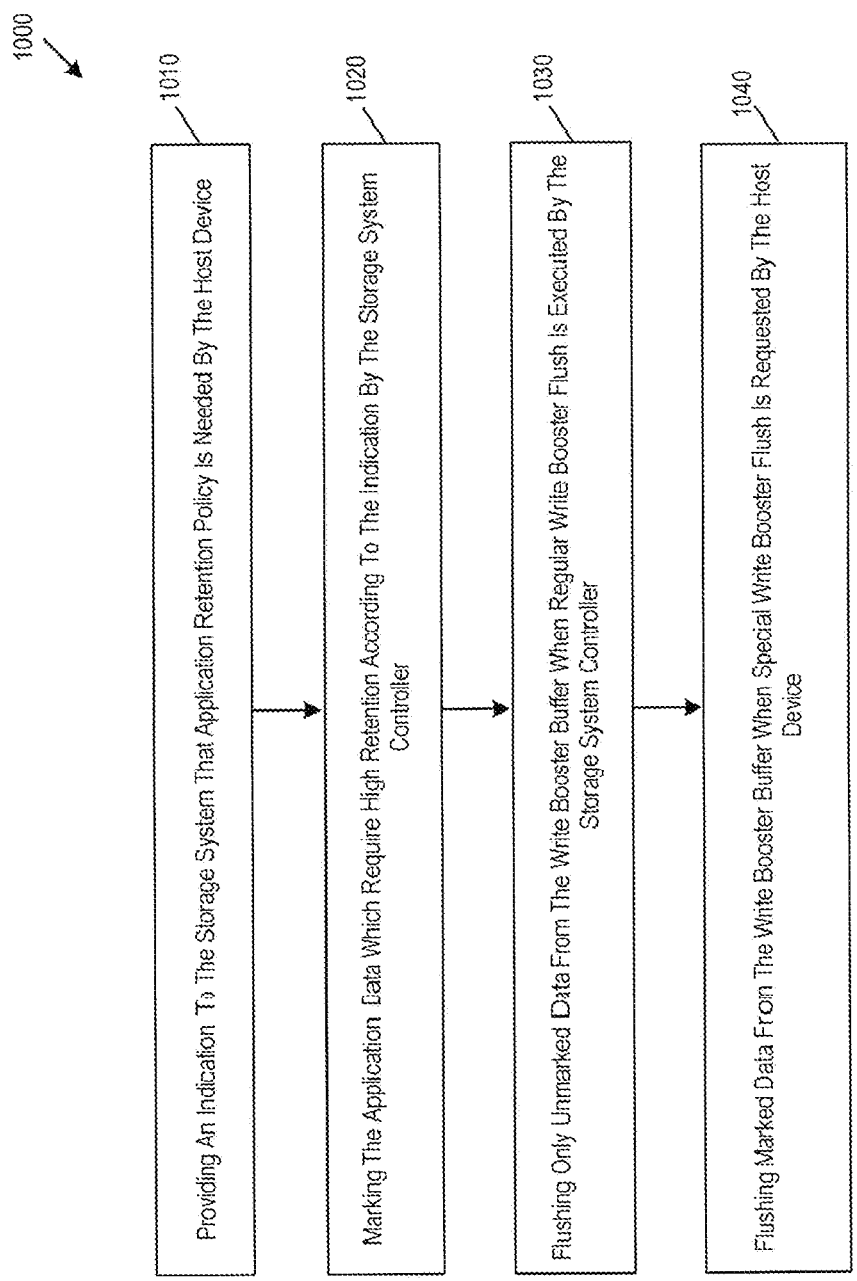
FIG. 10 is a flow chart of a method of an embodiment for using a read booster.

Returning to the drawings FIG. 10 is a flow chart 1000 of a method of an embodiment. As shown in FIG. 10, in this method, an indication is provided to the storage system 100 that the application retention policy is needed by the host 300 (act 1010). Next, the storage system's controller 102 marks the application data that require high retention according to the indication (act 1020). Then, the controller 102 flushes only un-marked data from the write buffer when a regular write buffer flush command is received from the host 300 (act 1030). The controller 102 later flushes marked data from the write buffer when a special write buffer flush command is received from the host (act 1040).

There are several advantages associated with these embodiments. For example, these embodiments can be used to improve read performance for applications that are more important to the host. These embodiments can also reduce write amplification and improve energy because they reduce the SLC-to-MLC transfer activity on data that is soon going to be re-written or discarded while still allowing the storage system to absorb new write bursts with the required SLC write buffer performance Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and wordlines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the embodiments described herein can be used alone or in combination with one another.

What is claimed is:

1. A storage system comprising:
   a memory; and
   a controller configured to:
      receive, from a host, a command for improved read performance for a logical block address range;
      in response to receiving the command for improved read performance:
         create a read buffer allocated from single-level cell (SLC) blocks in the memory;
         copy data stored in multi-level cell (MLC) blocks in the memory associated with the logical block address range into the read buffer; and create, in a logical-to-physical address data structure, an association between the logical block address range and physical addresses in the read buffer that store the data;
receive a read command from the host for the data;
in response to receiving the read command, send the data stored in the read buffer to the host;
receive, from the host, a command indicating that improved read performance is no longer needed for the logical block address range; and
in response to receiving the command indicating that improved read performance is no longer needed for the logical block address range, remove, from the logical-to-physical address data structure, the association between the logical block address range and physical addresses in the read buffer that store the data.

2. The storage system of claim 1, wherein the controller is further configured to create the read buffer in response to a number of free blocks in the memory exceeding a threshold.

3. The storage system of claim 1, wherein the data copied from the MLC blocks is identified by a logical block address received from the host prior to receiving the read command from the host.

4. The storage system of claim 1, wherein the controller is further configured to copy the data from the MLC blocks after predicting that the host will request the data.

5. The storage system of claim 1, wherein the controller is further configured to:
delete the data from the MLC blocks after the data has been copied into the read buffer; and
flush the data from the read buffer to the MLC blocks.

6. The storage system of claim 5, wherein the controller is further configured to flush the data from the read buffer to the MLC blocks in response to a flush command from the host.

7. The storage system of claim 5, wherein the controller is further configured to flush the data from the read buffer to the MLC blocks in response to a flush policy of the storage system.

8. The storage system of claim 1, wherein the data is fragmented in the SLC blocks, and wherein the controller is further configured to defragment the data when writing the data to the MLC blocks in response to a flush command.

9. The storage system of claim 1, further comprising a volatile memory, wherein the controller is further configured to copy, from the memory to the volatile memory, a portion of the logical-to-physical address data structure.

10. The storage system of claim 1, wherein the controller is further configured to provide an attribute that indicates one or more of following: a maximum size of the read buffer, a fullness of the read buffer, a health of the read buffer, and a health of blocks of the memory not used for the read buffer.

11. The storage system of claim 1, wherein the memory comprises a three-dimensional memory.

12. A storage system comprising:
a memory comprising single-level cell (SLC) blocks and multi-level cell (MLC) blocks;
means for receiving, from a host, a command for improved read performance for a logical block address range;
means for in response to receiving the command for improved read performance:
creating a read buffer allocated from single-level cell (SIX) blocks in the memory;
copying data stored in multi-level cell (MIX) blocks in the memory associated with the logical block address range into the read buffer; and
creating, in a logical-to-physical address data structure, an association between the logical block address range and physical addresses in the read buffer that store the data;
means for receiving a read command from the host for the data:
means for sending the data stored in the read buffer to the host in response to receiving the read command:
means for receiving, from the host, a command indicating that improved read performance is no longer needed for the logical block address range; and
means for removing, from the logical-to-physical address data structure, the association between the logical block address range and physical addresses in the read buffer that store the data in response to receiving the command indicating that improved read performance is no longer needed for the logical block address range.

13. In a storage system comprising a memory with single-level cell (SLC) blocks and multi-level cell (MLC) blocks, a method comprising:
receiving, from a host, a command for improved read performance for a logical block address range;
in response to receiving the command for improved read performance:
creating a read buffer allocated from single-level cell (SLC) blocks in the memory;
copying data stored in multi-level cell (MLC) blocks in the memory associated with the logical block address range into the read buffer; and
creating, in a logical-to-physical address data structure, an association between the logical block address range and physical addresses in the read buffer that store the data;
receiving a read command from the host for the data;
in response to receiving the read command, sending the data stored in the read buffer to the host;
receiving, from the host, a command indicating that improved read performance is no longer needed for the logical block address range; and
in response to receiving the command indicating that improved read performance is no longer needed for the logical block address range, removing, from the logical-to-physical address data structure, the association between the logical block address range and physical addresses in the read buffer that store the data.

14. The method of claim 13, further comprising creating the read buffer in response to a number of free blocks in the memory exceeding a threshold.

15. The method of claim 13, wherein the data copied from the MLC blocks is identified by a logical block address received from the host prior to receiving the read command from the host.

16. The method of claim 13, further comprising copying the data from the MLC blocks after predicting that the host will request the data.

17. The method of claim 13, further comprising:
deleting the data from the MLC blocks after the data has been copied in the read buffer; and
flushing the data from the read buffer to the MLC blocks.

18. The method of claim 17, further comprising flushing the data from the read buffer to the MLC blocks in response to a flush command from the host.

19. The method of claim 17, further comprising flushing the data from the read buffer to the MIX blocks in response to a flush policy of the storage system.

20. The method of claim 13, wherein the data is fragmented in the SLC blocks, and wherein the method further comprises defragmenting the data when writing the data to the MLC blocks in response to a flush command.

* * * * *